United States Patent [19]

Lur et al.

[11] Patent Number: 5,391,519
[45] Date of Patent: Feb. 21, 1995

[54] METHOD FOR INCREASING PAD BONDING OF AN IC (1)

[75] Inventors: Water Lur, Taipei; Ming-Tsung Liu, Hsinchu; Der Y. Wu, Miao-Li, all of Taiwan, Prov. of China

[73] Assignee: United Microelectronics Corp., Hsinchu, Taiwan, Prov. of China

[21] Appl. No.: 164,342

[22] Filed: Dec. 9, 1993

[51] Int. Cl.6 ...................... H01L 21/44; H01L 21/48
[52] U.S. Cl. .................................. 437/190; 437/192; 437/195
[58] Field of Search ..................... 437/190, 192, 195

[56] References Cited

U.S. PATENT DOCUMENTS 4,824,803  4/1989  Us et al. ............................ 437/192

Primary Examiner—Brian E. Hearn
Assistant Examiner—Michael W. Russell
Attorney, Agent, or Firm—Ladas & Parry

[57] ABSTRACT

In the fabrication of VLSI circuits, the diffusion barrier layer on the pad areas are removed prior to the formation of metal layer. Metal layer on the pad areas are thus directly contact with the underlying $SiO_2$ layer, thereby improving the pad bonding yield.

6 Claims, 3 Drawing Sheets

METHOD FOR INCREASING PAD BONDING OF AN IC (1)

BACKGROUND

The present invention relates to a method for improving pad bonding of an IC, and in particular to a method of improving the pad bonding of an IC by removing diffusion barrier layer on the pad area of a VLSI circuit.

In the fabrication of VLSI circuits, a diffusion barrier layer, such as Ti/TiN or Ti/Ti:W, has been widely introduced between aluminum alloy and silicon contact to avoid the abnormal interfacial diffusion and increase the circuit lifetime. However, it is easy to form an unstable compound of $TiSixOy$ between Ti layer and underlying dielectric, e.g. BPSG (Boro phospho silicate glass). This unsatable compound shows poor adhesion on underlying BPSG and always result in bad bonding yield on the connection from circuit pad to package frame.

In order that the disadvantage of the above-mentioned conventional technique can be better understood, the process of fabricating conventional VLSI circuits is described hereinafter with reference to FIGS. 1a to 1e.

Referring now to FIG. 1a, a Si substrate 10 is laterally isolated with a field oxide 12 with a thickness of 3000 to 8000 A° by using for example LOCOS (Local Oxidation of Silicon) technology so that an active region is formed on the Si substrate 10. The isolation region, i.e. the field oxide 12, may be formed by other conventional methods understood by those skilled in this art, for example by the trenched dielectric method. After the isolated field oxide 12 is formed, a doped polysilicon or polycide is deposited on a gate oxide 14 to a thickness of 1500 to 4000 A° which is then etched to form a gate elective 16. Thereafter, the N+ (or P+) source/drain regions 18 are formed by implanting with As+ or P+ for N+ and $BF_2^+$ or B+ for P+ to a dose of between about 1E14 to $1E16/cm^2$ and energy of between about 10 to 200 KeY, followed by a high temperature activation. In some VLSI circuits, lightly doped drain(LDD) or double diffused drain(DDD) structures or the like are used.

The next step can be seen with reference to FIG. 1b. The FIG. 1a transistor structure is then deposited to form a premetal dielectric $SiO_2$ layer 20, typically Borosilicate glass(BSG) or Borophosphosilicate glass(BPSG) with a thickness of between about 3000 to 10000 A° followed by a high temperature densification. The densification involves placing chips in a high temperature ambient to make the deposited premetal dielectric $SiO_2$ layer 20 densified and stable. Metal contact windows 22 are then formed on the densified premetal dielectric $SiO_2$ layer 20 by dry or wet etching.

The next step is shown in FIG. 1c wherein diffusion barrier layers TiN 24/$TiSi_2$ 26 are formed on the metal contact windows 22, and TiN 24/$TiSixOy$ 28 layers are formed on the premetal dielectric $SiO_2$ layer 20. The formation of diffusion barrier layer is completed by sputtering Ti, followed by rapid thermal annealing in a nitrogen ambient. Alternatively, the diffusion barrier layer can be formed by sputtering a bi-layered structure of Ti and TiN, or Ti and Ti:W, followed by the same kind of rapid thermal annealing.

Referring now to FIG. 1d, on the diffusion layers are then deposited with a metal layer 30, usually an Al alloy such as Al-Si(0–2%)-Cu(0.5–4%) with a thickness of about 4000 to 10000 A°. The metal layer 30 is then patterned using conventional lithography and etching techniques to form the patterns as shown in the drawing.

The final series steps involve depositing a passivation layer 32, typically $SiO_2$ and $Si_3N_4$ layers with a total thickness of about 5000 to 20000 A° by Chemical Vapor Deposition(CVD), patterning and then forming a pad area 34 by masking and etching the passeration layer 32. The finished VLSI circuit is shown in cross section in FIG. 1e.

According to the above conventional technique for fabricating VLSI circuits, the presence of the diffusion barrier layers is used to get rid of aluminum spiking and silicon precipitate on contacts. Al-Si-Cu alloys are used as the metal layer 30 for the purpose of solving the aluminum spiking problem. However, using Al-Si-Cu alloys results in an excessive amount of Si precipitation on the surface of the Si substrate 10 underlying the metal contact windows 22, thus increasing the contact resistance thereof. Moreover, with the scaling down of the device dimensions in VLSI circuits, it is desired to increase the stepcoverage of the metal layer of metal contact Windows 22, and thus a higher sputtering temperature may be used. This will worsen the silicon precipitation problem. In order to solve the above problems, diffusion barrier layers of TiN 24/$TiSi_2$ 26 are formed on metal contact windows 22. However, this step also forms a unstable $TiSixOy$ layer 28 on premetal dielectric $SiO_2$ layer 20. As this unstable layer 28 exhibits poor adhesion to the underlying premetal dielectric $SiO_2$ layer, it results in bad pad bonding yields.

SUMMARY OF THE INVENTION

It is therefore an object of the invention to provide a method for increasing pad bonding of an IC.

The object of the invention can be attained by providing an additional step to remove the diffusion barrier layer on the pad area prior to the formation of metal layer.

According to an aspect of the method of the invention, the diffusion barrier layer not located on the pad area is retained, thereby the resulting VLSI circuits still have the advantages of having low resistance in metal contact windows and long metal layer lifetime.

BRIEF DESCRIPTION OF DRAWINGS

The present invention will be described in detail with reference to the illustrated embodiment and the accompanying drawings, in which.

DETAILED DESCRIPTION OF THE INVENTION

Figure 1A:
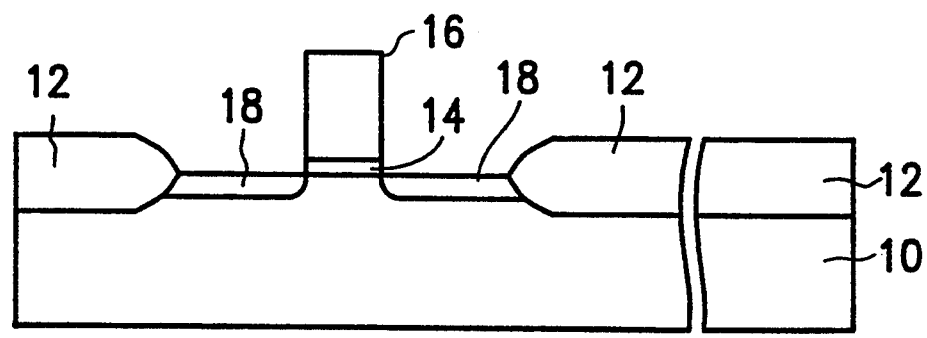
FIGS. 1a through 1e are schematic cross sectional representations of the conventional method for fabricating VLSI circuits, in which only one transistor region and its peripheral pad area are shown for ease of description, it being understood that many transistors and many pads are often implemented in a VLSI circuit.
Figure 1B:
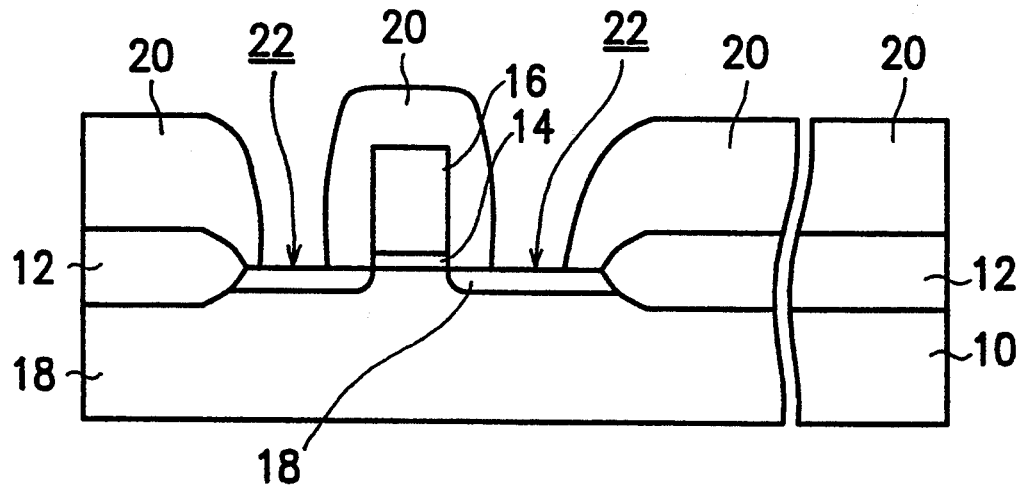
Figure 1C:
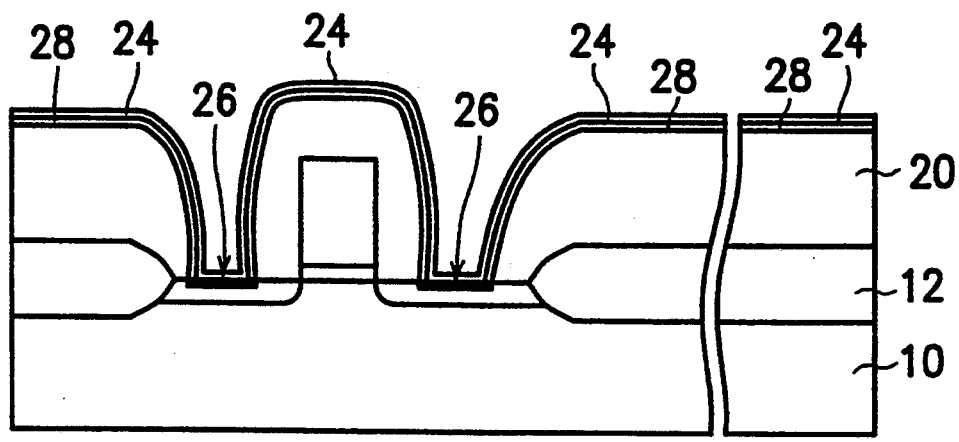
Figure 1D:
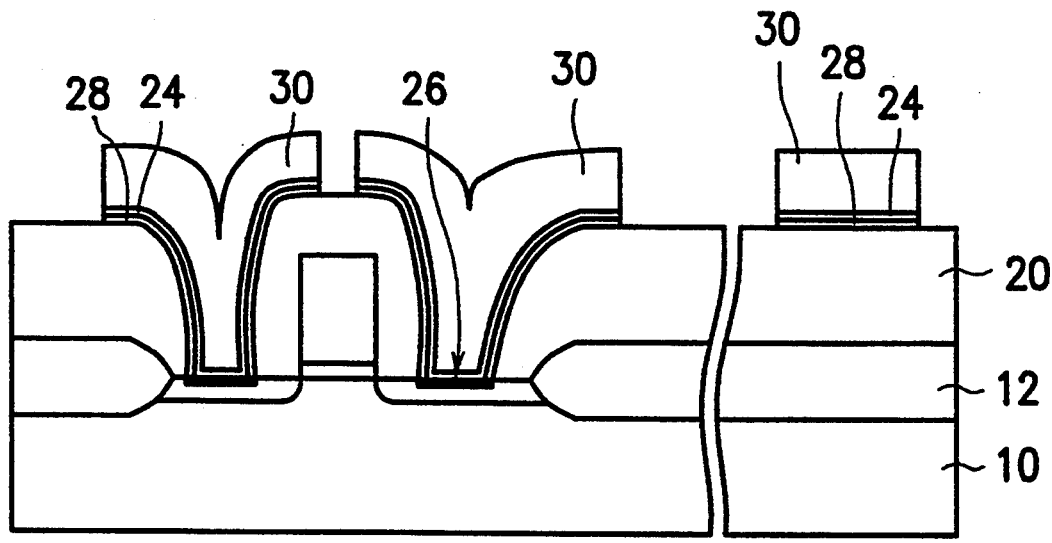
Figure 1E:
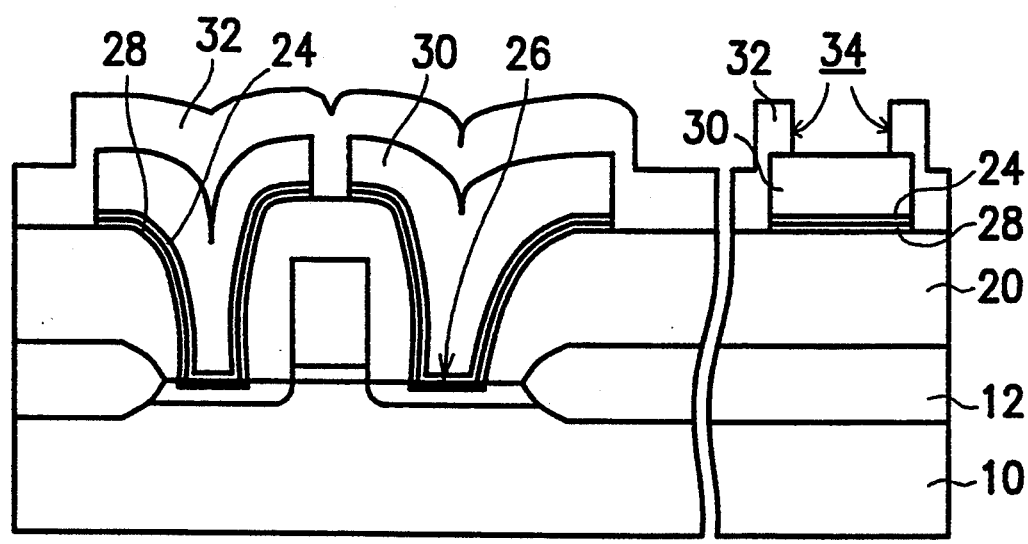
Figure 2:
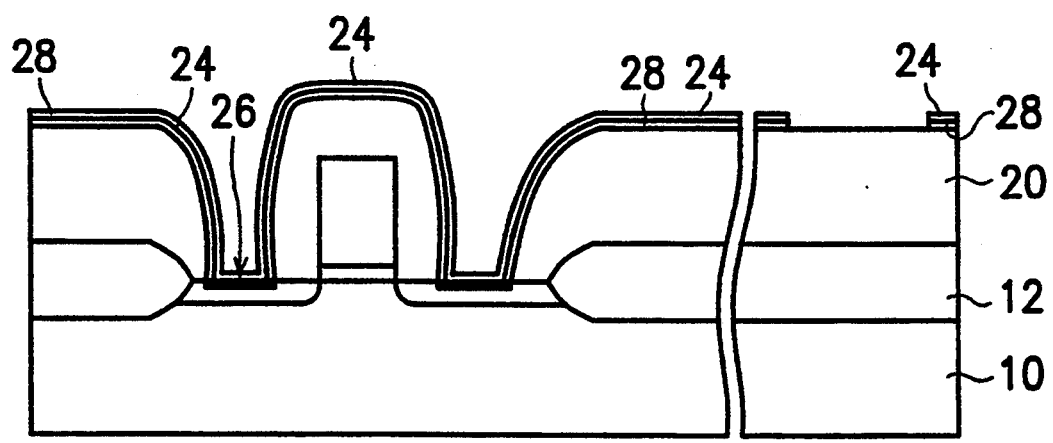
FIG. 2 schematically shows in cross section the diffusion barrier layer on the pad area has been removed according to an embodiment of the method of the invention.
Figure 3:
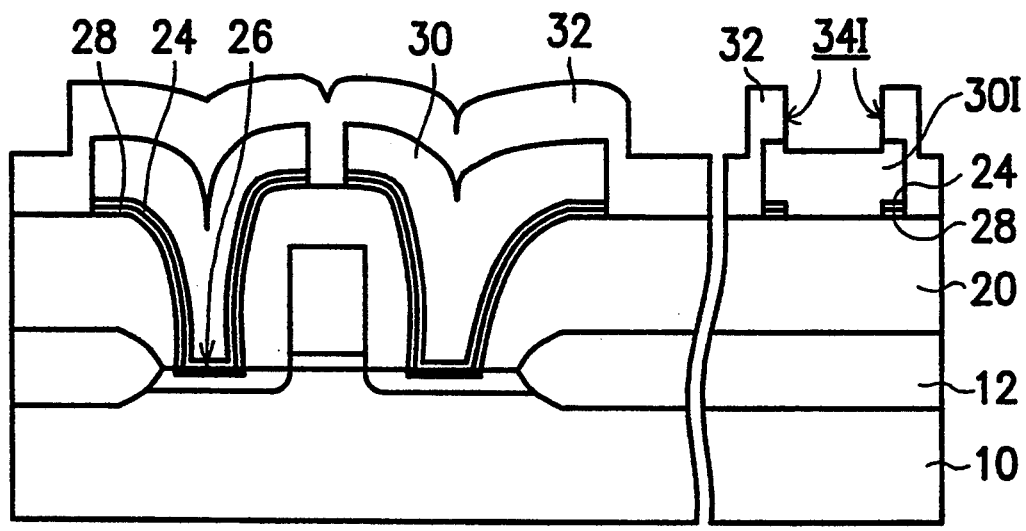
FIG. 3 schematically shows in cross section the finished IC according to the method of the invention.

According to the method of the invention, the same procedures as illustrated by FIGS. 1a to 1c are carried out before the diffusion barrier layer on pad areas are removed. The characteristic step of the invention is shown in FIGS. 2 and 3, in which same elements are given the same reference number. Referring now to FIG. 2, the diffusion barrier layers 24 and 28 (TiN and TiSixOy) on the pad areas have been ethched and the underlying SiO$_2$ layer is exposed. Note that the mask used in the removing step is the same mask which is subsequently used in the formation of pad area 34I through passivation layer 32. After the diffusion barrier layers 24 and 28 on the pad areas have been removed, the same steps as in the conventional process are carried out, that is, the Al-Si-Cu metal layers 30, 30I, passivation layer 32 and pad area 34I are sequentially formed. As shown in FIG. 3, since the Al-Si-Cu layer 30I on the pad area 34I contact with the underlying SiO$_2$ layer 20 directly, but not through a unstable, poor adhesive TiSixOy layer 28, and the adhesion between Al-Si-Cu metal layer 30I and the underlying SiO$_2$ layer is good, bonding on the connection from circuit pad to package frame can be improved.

What is claimed is:

1. A method of improving pad bonding of an IC, wherein said IC is prepared by (a) forming at least one active region on a Si substrate, (b) forming at least one transistor on said active region, (c) forming a premetal SiO$_2$ layer for isolation, (d) forming a plurality of metal contact windows, (e) forming a diffusion barrier layer in said contact windows and on said premetal SiO$_2$ layer, (f) forming a metal layer on said diffusion barrier layer and patterning, (g) forming a passivation layer on said metal layer and patterning, and (h) forming at least one pad area by masking and etching the passivation layer, said method comprising a step of (i) removing the diffusion barrier layers in said at least one pad area by masking and etching operations after step (e) and before step (f).

2. The method as claimed in claim 1, wherein the patterning of step (g) is conducted using a mask, said mask also being used during the masking operation of step (i) of the removing step and etching.

3. The method as claimed in claim 1, wherein forming of metal layer of step (f) produces a Al-Si-Cu layer which covers at least said at least one pad area, wherein the Al-Si-Cu layer in the pad area contacts directly with the premetal SiO$_2$ layer for isolation.

4. The method as claimed in claim 1, wherein the forming of diffusion barrier layer of step (e) comprises sputtering Ti, followed by rapid thermal annealing in a nitrogen ambient.

5. The method as claimed in claim 1, wherein the forming of diffusion barrier layer of step (e) comprises sputting a bi-layered structure of Ti and TiN, followed by rapid thermal annealing in a nitrogen ambient.

6. The method as claimed in claim 1, wherein the forming of diffusion barrier layer of step (e) comprises sputting a bi-layered structure of Ti and Ti:W, followed by rapid thermal annealing in a nitrogen ambient.

* * * * *